United States Patent
O'Neal

(10) Patent No.: US 8,295,412 B1
(45) Date of Patent: Oct. 23, 2012

(54) COMPACT FILTER DESIGN

(75) Inventor: Jeremy R. O'Neal, West Warwick, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 289 days.

(21) Appl. No.: 12/894,625

(22) Filed: Sep. 30, 2010

(51) Int. Cl.
*H03D 1/00* (2006.01)

(52) U.S. Cl. ............ 375/343; 324/76.28; 375/232; 375/350; 708/319; 708/406; 708/423; 708/507; 708/508

(58) Field of Classification Search ............. None
See application file for complete search history.

*Primary Examiner* — David C. Payne
*Assistant Examiner* — Adolf Dsouza
(74) *Attorney, Agent, or Firm* — James M. Kasischke; Michael P. Stanley; Jean-Paul A. Nasser

(57) ABSTRACT

An apparatus and method for signal detection in which a digital sample stream is fed round robin into a plurality of buffers, which are sequentially compared with a reference signal to determine a match. A processor determines the chronological order of the samples in each bit of each buffer, and directs a bitwise comparison between the signal in each buffer with the reference to determine a match, e.g., by correlation. The apparatus and method are preferably implemented with a Field-Programmable Gate Array (FPGA). This scheme permits real time correlation of a data stream with a reference without use of shift registers, or a significant number of dedicated logic blocks.

14 Claims, 3 Drawing Sheets

COMPACT FILTER DESIGN

STATEMENT OF GOVERNMENT INTEREST

The invention described herein may be manufactured and used by or for the Government of the United States of America for Governmental purposes without the payment of any royalties thereon or therefor.

CROSS-REFERENCE TO OTHER PATENT APPLICATIONS

None.

BACKGROUND OF THE INVENTION (1) Field of the Invention

The invention pertains generally to digital communication, in particular to digital signal processing and signal detection in the presence of noise, particularly using matched filters.

(2) Description of Prior Art

Several basic and often conflicting problems in signal detection are maximizing the signal to noise ratio of the detection process, minimizing the amount of engineering resources necessary for detection, and maximizing the speed of detection. A standard approach, if one has a priori knowledge of an incoming signal, is to detect the signal by correlating it with a matched filter, i.e., a filter whose impulse response is the time reversed complex conjugate of the expected signal. Moreover, if one has a priori knowledge of signal phase, one can further increase signal to noise ratio by sampling the signal at the Nyquist rate and only in the frequency domain vicinity of expected signal peaks. If, on the other hand, one has no prior knowledge of signal phase, one must asynchronously (incoherently) oversample the signal at higher than the Nyquist rate to increase the likelihood of sampling at or near optimum phase, i.e., at or near peaks. This type of sampling requires more computing power, more sample bits and larger sample bit sizes, and more programmable logic blocks to implement the shift registers needed for real time correlation of incoming signals with reference signals. If one wishes to compare an incoming signal with a number of reference signals, one must perform the comparison serially with each of the several reference signals, an inherently slow process if one uses only one register for the incoming signal. Conversely, if one feeds the incoming signal in parallel to plural registers each associated with one reference signal, the process is faster but at the cost of significantly more dedicated registers and logic blocks.

A device commonly used in digital signal processing is the Field-Programmable Gate Array (FPGA), which is an integrated circuit containing large arrays of configurable logic blocks and dedicated random access memory blocks. A configurable logic block typically contains programmable look-up tables that can implement low-level combinational logic. Configurable logic blocks are connectable to one another and can effect extremely complex combinational logic functions such as shift registers, state machines, and even microprocessors. FPGAs are easily reconfigurable and reprogrammable as desired, thus making them ideal for development applications.

SUMMARY OF THE INVENTION

Accordingly, an object of the invention is to permit comparison of digital signals, including correlation of digital signals, without use of shift registers.

Another object is comparing digital signals in a manner that increases signal to noise of such detections, and thereby reduces the error rate of such detections.

Another object is comparing digital signals using oversampling.

Another object is to permit asynchronous detection using oversampling.

Another object is to permit comparison of a digital signal to multiple other reference signals simultaneously, without a corresponding multiplication of hardware necessary for the comparisons.

In accordance with these and other objects made apparent hereinafter, the invention concerns an apparatus and method in which a processor receives a digital stream from a sampled signal and stores the samples in round robin fashion in a plurality of buffers. This is done in each buffer by overwriting the oldest of the digital samples stored there with the newest sample. A comparator performs a bitwise chronological comparison between a reference digital signal, e.g. the digital impulse response of a preselected matched filer, and each of the buffers. In this manner, the samples are constantly shifted in a virtual manner so that the reference signal is compared constantly in real time to a chronologically ordered sample stream, but without use of shift registers, and with relatively few logic blocks. The processor is especially advantageously implemented in a Field-Programmable Gate Array (FPGA).

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein.

DETAILED DESCRIPTION OF THE INVENTION

Figure 1:
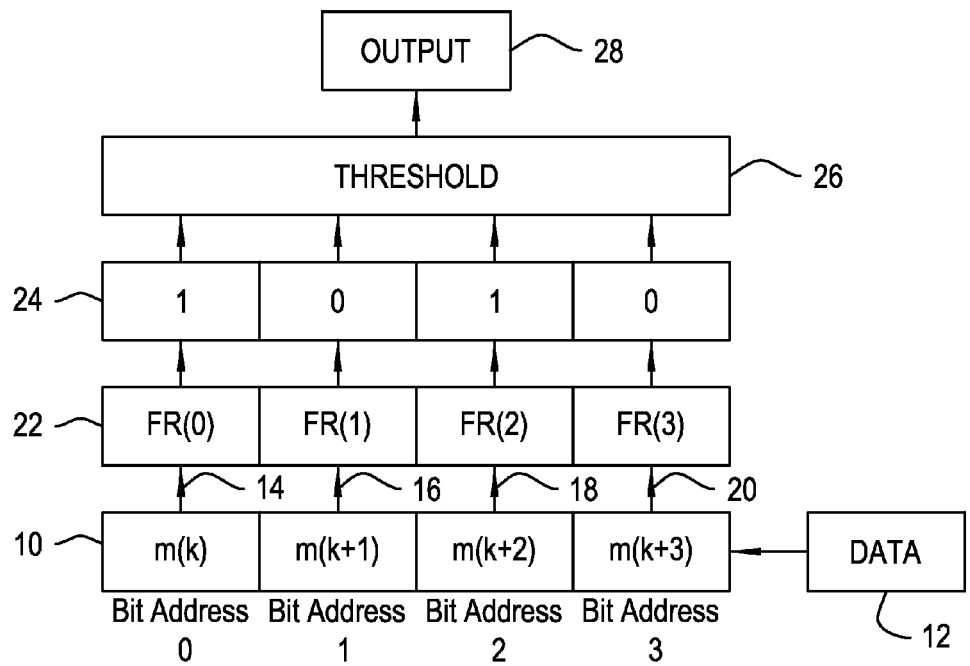
FIG. 1 is a schematic illustrating an existing method of comparing digital signals.

With reference to the drawing figures, wherein like numbers indicate like parts throughout the several views, FIG. 1 shows a conventional way of comparing two digital signals, for example as part of a correlation process. Buffer 10 receives a continuous digital data stream m(k), m(k+1), etc., from data source 12 where k and i are integer indices, and m(k+i) represents a sample taken at system time stamp k+i. The numerical values of the samples are preferably hard limited to be either 0 or 1, so that the bits of buffer 10 constitute a simple binary number, which is four bits long. The bit size is arbitrary so long as the number of bits in conjunction with the sampling rate and the spectral content of the analog signal being sampled, satisfy the Nyquist criterion, with sufficient oversampling to yield an acceptable bit error rate. The address of individual bits of buffer 10 are identified as 0 through 3 as shown in FIG. 1. A shift register (not shown) moves the binary stream across buffer 10 (from right to left in FIG. 1), where bit zero contains the oldest sample in buffer 10, and bit 3 the newest. The bits of buffer 10 have bitwise connections 14, 16, 18, 20, to corresponding bits of a matching buffer 22, which stores a fixed digital word FR(0), FR(1), FR(2), FR(3), where FR indicates filter replica, and the argument 0 through 3 indicates the bit address. Use here of the term "filter replica" is to suggest that the digital data stored in matching buffer 22 can be the impulse response of a matched filter, sampled at the same rate as is the data stream traversing buffer 10, and matched, for example, to an analog carrier frequency on which is modulated digital or analog information. At each time stamp, bits 0 through 3 of buffer 10 are compared to corresponding bits 0 through 3 of matching buffer 22, to indicate bit matches, for example by taking the exclusive NOR of each bit pair. Result buffer 24 contains the output of the exclusive NORs, which in the example of FIG. 1 shows bits 0 and 2 matched between buffers 10 and matching buffer 22, and bits 1 and 3 not matched. Processor 26 receives the output of result buffer 24, and applies a preselected thresholding criterion, such as whether a sufficient number of bits match, to determine whether to deem binary data in buffers 10 and 22 a match, and thereby subsequently annunciate a match, or take other appropriate action in output 28. Because the data stream passes continually through buffer 10, the data stream is continually tested for a match with the digital word in matching buffer 22.

Figure 2:
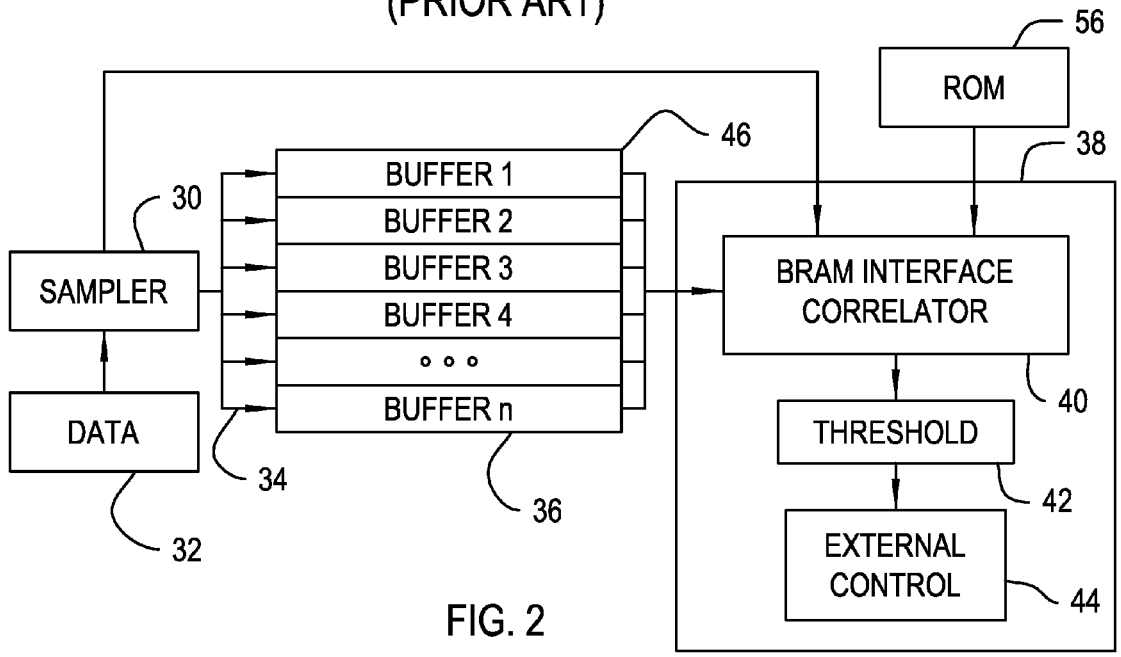
FIG. 2 is a plan view of a system according to the invention.

FIG. 2 shows in broad outline a system according to an embodiment of the invention. Sampler 30 digitally samples a data source 32 to produce a digital data stream like the m(k+i)'s of FIG. 1. The sample rate being n times the fundamental frequency of the analog signal where n equals the oversampling rate. Line 34 feeds the samples in round robin fashion to RAM 36, which contains n buffers. By round robin, it is meant that sampler 30 sends a first of n samples to buffer 1 for storage, the second to buffer 2, and so on through the nth sample to buffer n, and then repeats. Thus, for example, over a series of n consecutive samples starting with m(k), buffer 1 receives samples m(k), m(k+n), m(k+2n), etc.; buffer 2 receives samples m(k+1), m(k+n+1), m(k+2n+1), and so forth for all n buffers. In a manner discussed below, samples stored in the RAM buffers 36 are sent to processor 38, which contains correlator 40 for comparison of the data stored in the buffers 36 to known digital signals (e.g., filter replicas as in FIG. 1) stored in ROM 56, to thresholder 42 to identify signal matches, and to external control 44 for annunciation of matches, or other appropriate action. RAM 36, ROM 56, and processor 38 may be portions of a programmable digital processor, such as a dedicated computer, but preferably, for reasons discussed below, a Field-Programmable Gate Array (FPGA). ROM 56 is only limited to read-only memory in the current embodiment. It may take other forms in other embodiments.

Figure 3:
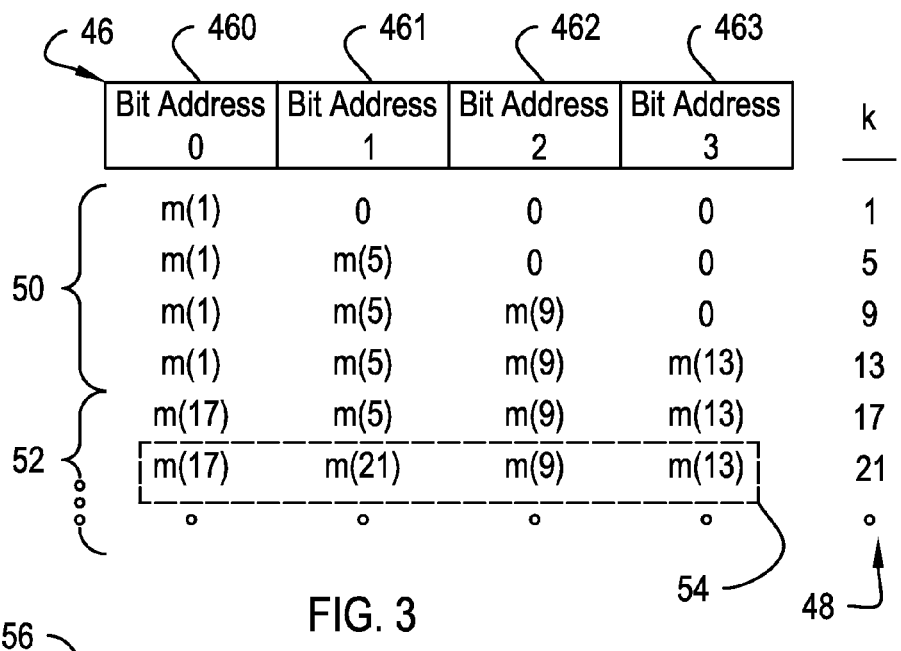
FIG. 3 is a schematic in tabular form illustrating the accumulation of sample data according to an embodiment of the invention.

The round robin accumulation of data in RAM 36 is better seen in FIG. 3, which tabulates data as stored in buffer (indicated at 46), at times k=1 through 21, shown in column 48. Buffer 1 is again illustrated as having four bits, with respective bit addresses 0 through 3, and RAM 36 itself has four buffers (n=4) (not shown in FIG. 3) of four bits each. Bit address 0 is identified as 460, bit address 1 is identified as 461, bit address 2 is identified as 462, and bit address 3 is identified as 463. Beneath buffer 1 in FIG. 3 are seven lines, each line having four entries, each entry is located under a specific bit of buffer 1. Associated with each of these seven lines is a value of k, indicating that the associated line represents the data stored in buffer 1 after each corresponding kth sample.

Initially, each bit of each of the buffers 46 of RAM 36 may have a value of digital zero. At time k=1, sampler 30 begins generating digital samples m(k), where k=1, 2, 3, . . . . Sampler 30 writes m(1) into bit address 0 of buffer 1, and samples m(2) through m(4) in bit address 0 of buffers 2 through 4. At time k=5, the process repeats, writing sample m(5) in bit address 1 of buffer 1 (and samples m(6) through m(8) in bit addresses 1 of buffers 2 through 4). After the k=13$^{th}$ sample, collectively lines 50 in FIG. 3, each bit of buffer 1 contains a sample (and after the k=16$^{th}$ sample, each bit of the remaining buffers do also). Thereafter, as shown in group 52, at k=17 the process repeats, with sample m(17) overwriting the oldest sample in buffer 1 (bit address 0), sample m(21) overwriting sample m(5) in bit address 2, etc. In this manner, each new sample directed to buffer 1 overwrites the oldest sample in the buffer, and the same process occurs for each of the other three buffers (beginning with k=18 for buffer 2, k=19 for buffer 3, and k=20 for buffer 4). This causes the samples in the buffers to stream through with the oldest sample dumped and the newest sample added, but without using a shift register or otherwise moving samples from one buffer bit to another.

Figure 4:
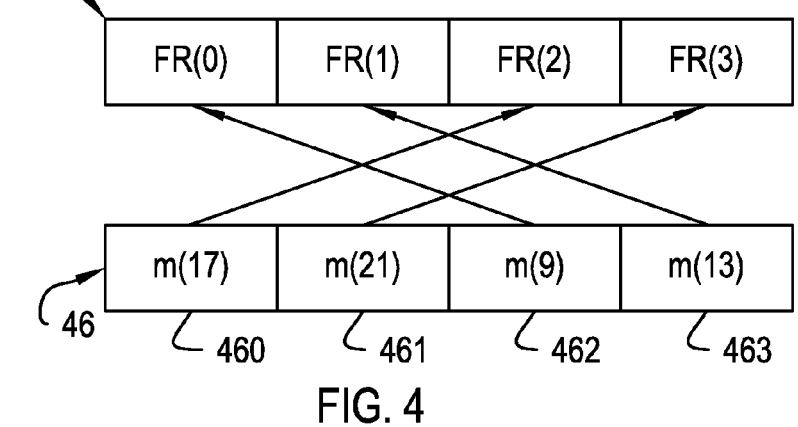
FIG. 4 is a schematic illustrating comparison of a detected signal to a reference signal according to the embodiment of FIG. 3.

In operation, processor 38 is programmed to effect a bitwise comparison between a preselected four bit reference sample (such as a four bit filter replica) of the kind shown in FIG. 1. Because the samples in the buffers are not in chronological order, processor 38 is programmed to know which bit addresses to compare with which bit of the reference sample for each buffer at each time stamp k, such that FR(0) is compared to the oldest sample in the buffer, FR(1) the next oldest, etc. For want of a better term, this sort of comparison is denominated a chronological comparison. FIG. 4 illustrates this for buffer 1 immediately after k=21 (line 54 of FIG. 3). Buffer 46 values are compared to filter replicas 56 having reference values FR(0), FR(1), FR(2), FR(3). Thus FR(0) is compared to bit 2 of buffer 1 (sample m(9)), FR(1) with bit 3 (m(13)), FR(2) with bit 0 (m(17)), and FR(3) with bit 1 (m(21)). Restating this, as the samples age, the processor 38 provides bits in the correct order to the filter replica 56.

Figure 5:
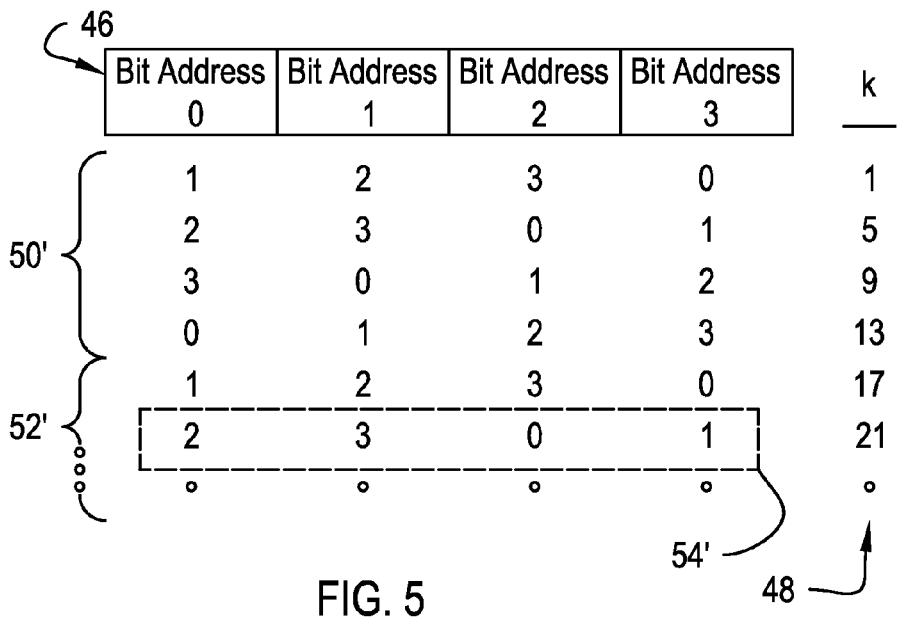
FIG. 5 is a schematic in tabular form of the embodiment according to FIG. 3, illustrating the order in which bits containing sampled data are to be compared to bits of a reference signal.
Figure 6A:
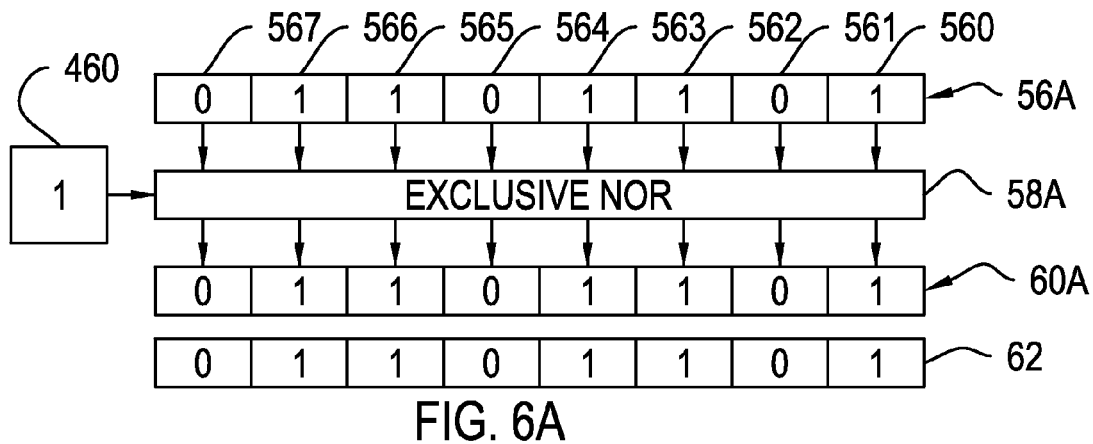
FIGS. 6A, 6B, 6C, and 6D are schematics showing an embodiment of the invention in which a detected signal is compared simultaneously to a plurality of reference signals.
Figure 6B:
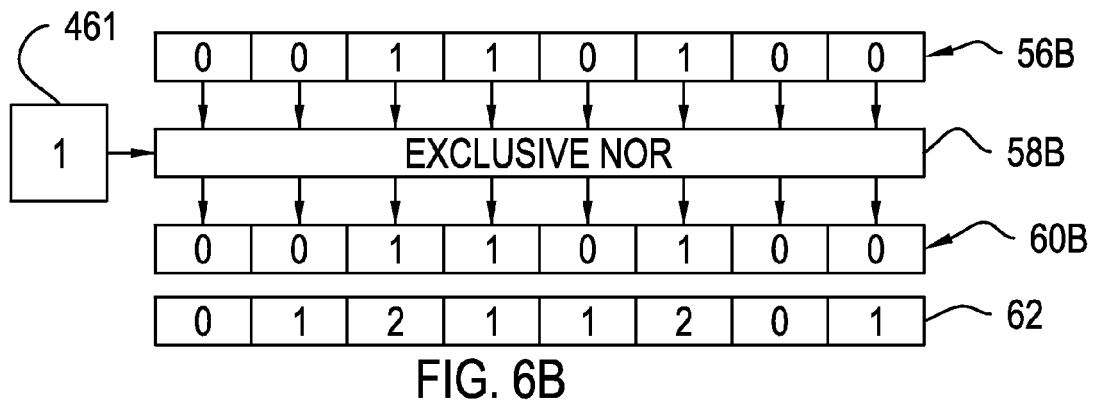
Figure 6C:
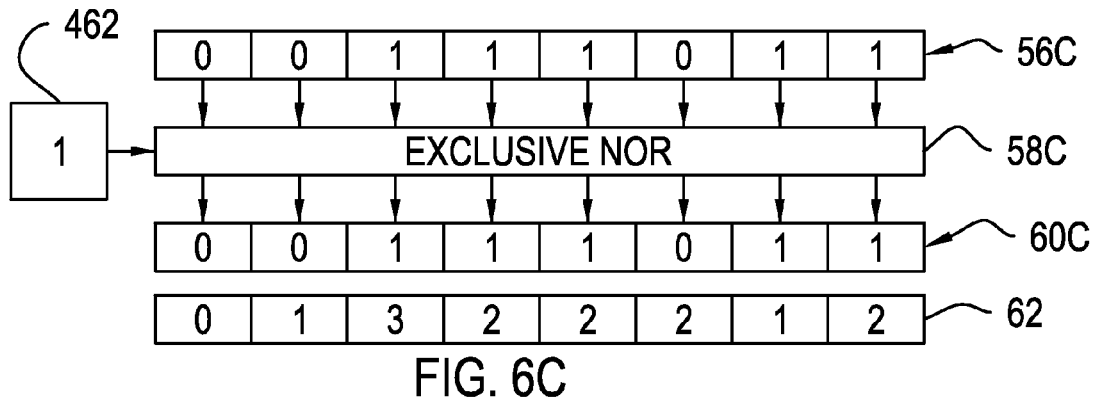
Figure 6D:
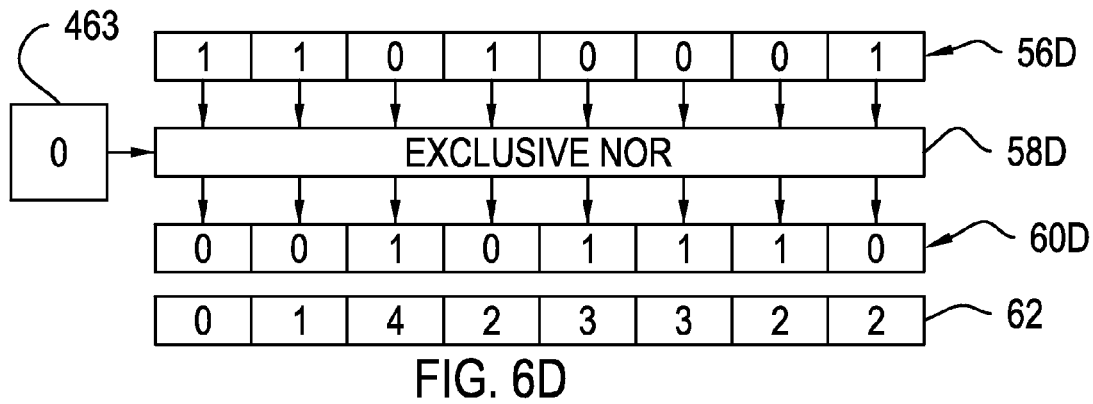

FIG. 5 is a tabulation similar to that of FIG. 3, but with filter replica buffer 56 again containing a reference signal with bit values FR(0) through FR(3), but in this case listing under each of these bits the corresponding bit of buffer 1 for comparison with each bit of the reference signal at each kth time stamp. As an example, line 54' of FIG. 5 corresponding to line 54 of FIG. 3, indicates that, immediately after k=21, FR(0) through FR(3) are to be compared to respective bits 2, 3, 0, 1 of buffer 1. The tabulations of FIGS. 3 through 5 are valid for buffers 2 through 4, save that values of k are one higher in buffer 2, two higher in buffer 3, etc.

One can implement the scheme of FIGS. 2 through 5 in any digital computer or other processor which is programmable and contains writable and arbitrarily addressable memory. A Field-Programmable Gate Array (FPGA) is uniquely suited to do so, as it has the requisite memory and is programmable in the way of state machines to perform logic on data in its memory. For example, the bit sequences of FIGS. 3 through 5 can be implemented in a FPGA using multiple state machines and combinational logic. In so doing, such a processor uses a minimal amount of logic blocks, and, in particular, no shift registers. This provides a simpler and lower resource device for performing the calculations performed in the prior art device of FIG. 1.

If one uses volatile storage, the data in RAM 36 are arbitrary upon initial power up. Thus at power up the values in the bits of the buffers cannot literally be characterized as varying from newest to oldest. For purposes of nomenclature, such unwritten bits are considered oldest to newest in the order in which data is to be written into them. Thus, in the scheme of FIGS. 2 through 5, at power up bit 0 of each buffer is oldest in this sense, and bit 3 newest. This is consistent with the address sequencing in FIG. 5.

The choice of n=4 buffers and of four bits per buffer is arbitrary. One could use a buffer as small as two bits, the minimum for generating statistically independent and hence detectable samples, and as few as one buffer, or a virtually unlimited number of buffers. However, the larger the number of buffers and/or bits, the more computing resources one consumes; the fewer the bits per buffer, the smaller the likelihood of signal detection. In most cases, an optimal system will have the number of bits in each buffer dictated by the specific signal one wishes to detect, and will have the same number of buffers as the desired oversampling rate.

FIGS. 6A, 6B, 6C and 6D shows an embodiment of the invention which, at each kth time stamp, can simultaneously compare a RAM buffer's data to multiple reference signals stored in ROM. In this embodiment, the reference signals are filter replicas FR(0) through FR(7) respectively identified as 560, 561, 562, 563, 564, 565, 566 and 567. These are loaded in filter replica buffer 56 such as that shown in FIG. 4. The reference signals extend vertically across FIGS. 6A, 6B, 6C, and 6D, such that, the first bit of FR(0) is stored at address 560 of buffer 56A, the second bit at address 560 of buffer 56B, the third bit at the same address in 56C, and the final bit in 56D. It can be seen that FR(0) has exemplary bit values (1, 0, 1, 1). Using this pattern, FR(5) has exemplary bit value (1, 1, 1, 0) stored at address 565 of buffers 56A, 56B, 56C and 56D. The concatenated zero bits of FR(7) through FR(0) are (0, 1, 1, 0, 1, 1, 0, 1) stored in buffer 56A. The contents 460, 461, 462 and 463, of one buffer 46, i.e., the one which has just had a sample written into it at the kth time stamp, and whose exemplary values in FIGS. 6A, 6B, 6C and 6D are (1, 1, 1, 0)), are fed sequentially into corresponding logic blocks 58A, 58B, 58C and 58D. The oldest sample identified as 460 in buffer 46 is fed into logic block 58A, the newest sample in buffer address 463 is provided in-turn to logic block 58D. As each bit 460, 461, 462, and 463 is sequentially fed into logic blocks 58A, 58B, 58C and 58D, bit addresses 0 through 3 of each reference signal in ROM 56 are moved into corresponding logic block 58A, 58B, 58C and 58D. Each logic block 58A, 58B, 58C and 58D in-turn performs a concurrent exclusive NOR operation between the input buffer bit value to each bit of each filter replica to identify matches there between. (Thus, e.g., the oldest sample in the buffer is simultaneously compared by an exclusive NOR with bit address zero of each reference signal, the second oldest bit sample in the buffer is then similarly compared to the bit address one of each reference sample, etc.) For each four bits sequentially, matches are reported by writing a 1 in respective storage areas 60A, 60B, 60C and 60D, and mismatches reported by writing a zero. An accumulator 62 adds together the total number of matches, upon which thresholder 42 (FIG. 2) determines which, if any, of the reference signals match the sampled signal in the buffer. In the example given in FIGS. 6A, 6B, 6C and 6D, reference signal FR(5) is the best match, with all four of its bits matching the buffer samples. This can be seen from accumulator 62 in FIG. 6D in the column identified as 565 in FIG. 6A. From FIG. 6D accumulator 62 in columns 562 and 563, FR(2) and FR(3) are good candidates with three of four bits matched. Said process repeats at the next sample k using the next buffer in a round robin fashion. Although this embodiment adds logical elements, the addition of elements is minimally proportional to the number of reference signals, and is much smaller than if one replicated the scheme of FIG. 1 eight times to accommodate all eight reference signals.

It will be understood that many additional changes in the details, materials, steps and arrangement of parts, which have been herein described and illustrated in order to explain the nature of the invention, may be made by those skilled in the art within the principle and scope of the invention as expressed in the appended claims. Accordingly, the scope of the invention is to be discerned from reference to the appended claims, wherein:

What is claimed is:

1. An apparatus comprising:

a sampler disposed to receive a signal, said sampler being adapted to produce a stream of digital samples responsive to said signal, each digital sample having a same number of bits;

a plurality of buffers, each buffer having a plurality of addresses, joined to receive said stream of digital samples such that the digital sample bits from the sample are stored across the plurality of buffers in a corresponding address in each said buffer, and additional digital samples are stored in an additional corresponding address across the plurality of buffers until all addresses are full whereupon digital samples are stored replacing the oldest of said digital samples in said each of said plurality of buffers with the newest sample from said stream of digital samples;

a reference signal storage means having a plurality of digital reference signals stored therein;

a comparator effective to perform a bitwise chronological comparison between said each address of said plurality of buffers with each said reference signal of said reference signal storage means;

an accumulator joined to said comparator capable of tabulating the bitwise chronological comparison performed by said comparator; and a processor joined to said accumulator for receiving said tabulated comparisons, said processor being capable of making determinations concerning a relationship between said reference signal and said signal based on said tabulated comparisons.

2. The apparatus of claim 1, wherein the number of said plurality of buffers equals the oversampling rate.

3. The apparatus of claim 1, wherein said processor comprises a thresholder receiving said tabulated comparisons, said thresholder having a preprogrammed threshold level and being capable of providing an indication to said processor concerning the relationship between the tabulated comparisons and the threshold level.

4. The apparatus of claim 3, wherein said thresholder determines if said tabulated comparisons exceed the threshold level, and said processor indicates that said reference signal is a good match for said signal.

5. The apparatus of claim 4, further comprising a field programmable gate array having logical components and memory components, wherein:

said plurality of buffers are implemented in said memory components of said field programmable gate array;

said reference signal storage means is implemented in said memory components of said field programmable gate array;

said comparator is implemented in logical components of said field programmable gate array;

said accumulator is implemented using logical components of said field programmable gate array; and said thresholder is implemented using logical components of said field programmable gate array.

6. The apparatus of claim 1, wherein said comparator and said accumulator are implemented on a field programmable gate array.

7. The apparatus of claim 6, wherein said plurality of buffers and said reference signal storage means are implemented on a field programmable gate array.

8. A method comprising:
- sampling a signal to produce a stream of digital samples each having digital sample bits;
- providing a plurality of buffers, each buffer having a plurality of addresses;
- storing each digital sample wherein the digital sample bits from the sample are stored across the plurality of buffers in a corresponding address in each said buffer, and additional digital samples are stored in an additional corresponding address across the plurality of buffers until all addresses are full whereupon digital samples are stored replacing the oldest of said digital samples in said each of said plurality of buffers with the newest sample from said stream of digital samples;
- providing a digital reference signal;
- comparing the samples in said each of said plurality of buffers with a digital reference signal, wherein said comparing is done by a bitwise chronological comparison between said each of said plurality of buffers with said reference signal;
- tabulating the comparison performed in the step of comparing; and
- making determinations concerning a relationship between said reference signal and said signal based on said tabulated comparisons.

9. The method of claim 8, wherein said digital reference signal is a plurality of reference signals, and said comparing is done by a bitwise chronological comparison between said each of said plurality of buffers with said each of said plurality of reference signals.

10. The method of claim 9, wherein the number of said plurality of buffers equals the oversampling rate.

11. The method of claim 8, further comprising storing said plurality of reference signals in memory prior to said step of providing a digital reference signal.

12. The method of claim 8, further comprising the steps of programming a field programmable gate array to implement a plurality of buffers, to store said plurality of reference signals, to compare the samples, and to tabulate the comparison before said step of sampling.

13. The apparatus of claim 8, further comprising the step of:
- thresholding said tabulated comparisons to a predetermined threshold; and
- wherein the step of making determinations is based on said step of thresholding.

14. The apparatus of claim 13, wherein:
- said step of thresholding provides a determination of if said tabulated comparisons exceed the predetermined threshold; and
- said step of making determinations comprises indicating that said reference signal related to said tabulated comparison exceeding the predetermined threshold is a good match for said signal.

* * * * *